United States Patent [19]

Gore, III et al.

[11] Patent Number: 4,602,164

[45] Date of Patent: Jul. 22, 1986

[54] RADIATION SHIELD SYSTEM

[75] Inventors: Albert N. Gore, III, Raleigh; Robert C. Lynch, Cary; Ronald P. McAdams; Gregory A. Shekita, both of Raleigh, all of N.C.

[73] Assignee: International Business Machines Corp., Armonk, N.Y.

[21] Appl. No.: 696,834

[22] Filed: Jan. 31, 1985

[51] Int. Cl.$^4$ .......................... H04B 3/28; H05K 9/00
[52] U.S. Cl. ..................................... 307/91; 361/424; 361/393; 361/394
[58] Field of Search ..................... 307/89, 90, 91, 147, 307/150, 149; 361/394, 424

[56] References Cited

U.S. PATENT DOCUMENTS

| | | | |
|---|---|---|---|
| 3,691,432 | 9/1972 | Edfors et al. | 317/100 |
| 3,963,975 | 6/1976 | Gauper, Jr. et al. | 321/2 |
| 4,342,002 | 7/1982 | Gabr | 330/65 |
| 4,399,487 | 8/1983 | Neumann | 361/391 |
| 4,527,285 | 7/1985 | Kekas et al. | 455/607 |

*Primary Examiner*—William M. Shoop, Jr.
*Assistant Examiner*—Alfred Hoyte
*Attorney, Agent, or Firm*—Joscelyn G. Cockburn

[57] ABSTRACT

A methodology for packaging and grounding electronic devices including distributive data processing systems wherein a Main Processing Unit (MPU) and power supply are packaged within a common housing. The MPU and other electrical components are placed on a common support card or substrate. The substrate is provided with plugs for mating with the power supply and I/O connectors for mating with devices which may be remotely attached thereto. Each connector is fitted with a shielded receptacle that coacts with the common housing to provide EMC shielding for the MPU and other electrical components. The packaging is such that an untrained person may replace the card without compromising the integrity of the EMC shield.

6 Claims, 7 Drawing Figures

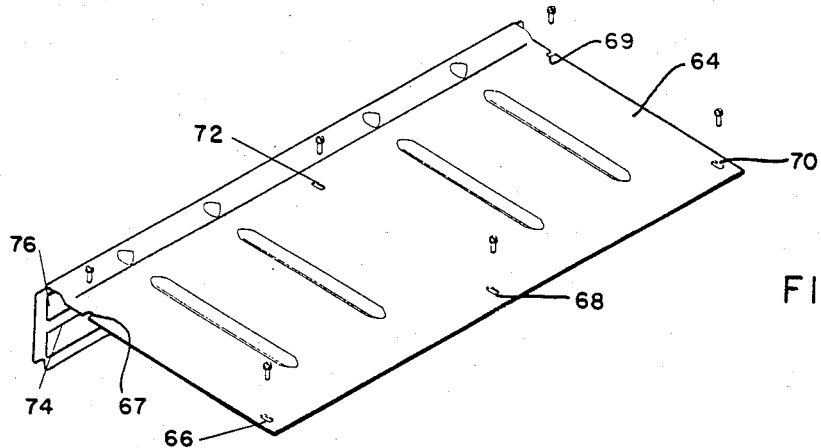
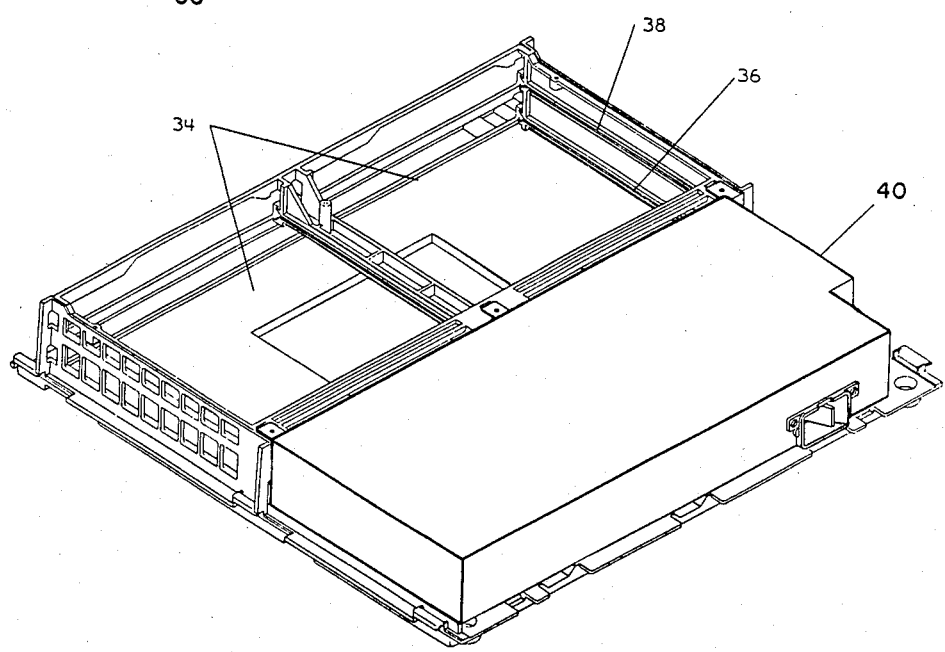
FIG. 4

RADIATION SHIELD SYSTEM

BACKGROUND OF THE INVENTION

1. Field of the Invention

The present invention relates to the packaging of electronic devices in general and in particular the packaging of said devices to provide protection against electromagnetic radiation.

2. Prior Art

There are many applications where it is desirable to provide electromagnetic radiation shielding which protects a device from externally generated radiation and prevents the device from radiating into the surrounding environment. Examples of such applications are data processing systems including personal computers and point of sale terminals. In describing the preferred embodiment for practicing the present invention, a point of sale terminal will be used as the example. However, it should be understood that the principal packaging technique and advantages are applicable to other devices.

In most countries the amount of radiation that a device can emit is regulated. A few companies have even set their own standards regarding radiation emission. In some cases the companies impose regulations even more stringent than the regulations of some countries. Thus, the problem arises as to the manner in which these regulations can be met.

It is well known in the art that electromagnetic emission can be controlled by encasing equipment in a conductive enclosure. Gaskets are used to control leakage from areas between two surfaces. Examples of this well-known technique are given in U.S. Pat. Nos. 4,396,795; 4,399,316; 4,322,572; 4,381,421 and 3,594,490.

In addition to the radiation problem, manufacturers are being asked to provide users with relatively low cost and reliable data processing devices. The cost of purchasing and operating a data processing device tends to increase if a customer engineer has to visit the customer location to install or correct a problem on the data processing device. To alleviate this cost problem, the prior art adopts the so-called Field Replaceable Unit (FRU) concept. The concept is one of modular design and packaging. Whenever a system goes down, the user identifies the defective FRU and replaces it with one that is not defective. The defective FRU is returned to the manufacturer or a designated repair center. There it is repaired and can be returned to a customer for reuse. Thus, when a machine problem occurs, a customer can correct the problem without using the services of the customer engineer.

In the past the above-identified problems have been treated as separate and independent problems. Neither the manufacturers nor the packaging industry have provided a satisfactory solution to either problem. As a result designs that optimize the solution for the customer maintenance problem do not adequately satisfy the radiation control problem and vice versa. Moreover, the prior art solutions require special tools and possibly some mechanical know-how since in most cases the covers of the machine must be removed so that one can gain access to the components inside the machine. Once the covers are removed, unless they are carefully replaced, usually by trained personnel, there is a high probability that the electromagnetic shielding is adversely affected.

SUMMARY OF THE INVENTION

It is therefore the general object of the present invention to provide a packaging methodology wherein a user may replace electrical components without comprising the electromagnetic radiation protection feature of the machine.

The present invention utilizes a modular packaging system which includes an electrically conductive housing connected to an electrically conductive power supply. The power supply is maintained at ground potential. A pair of floating electrical receptacles is mounted in spaced relationship on one surface of the power supply. A main logic card is provided to support a plurality of electrical devices. A pair of electrical plugs is mounted on the front surface of the card. The plugs are positioned to mate with the receptacles and to supply power to the card. A closure assembly comprising of a plurality of electrical receptacles or input/output (I/O) connectors and a planar member with a manually activated latching mechanism thereon is mounted on the back edge of the card. The configuration is structured so that when the card is plugged into the power supply and the latching mechanism is activated the closure means or assembly coacts with the conductive housing to provide EMI shielding of the card and electrical devices. When the latching mechanism is released, the closure assembly can be removed and the internals of the machine may be replaced.

BRIEF DESCRIPTION OF THE DRAWINGS

FIG. 4 shows the power supply nested in the shield envelope and the top surface of the radiation shield.

DETAILED DESCRIPTION OF THE PREFERRED EMBODIMENT

Figure 1:
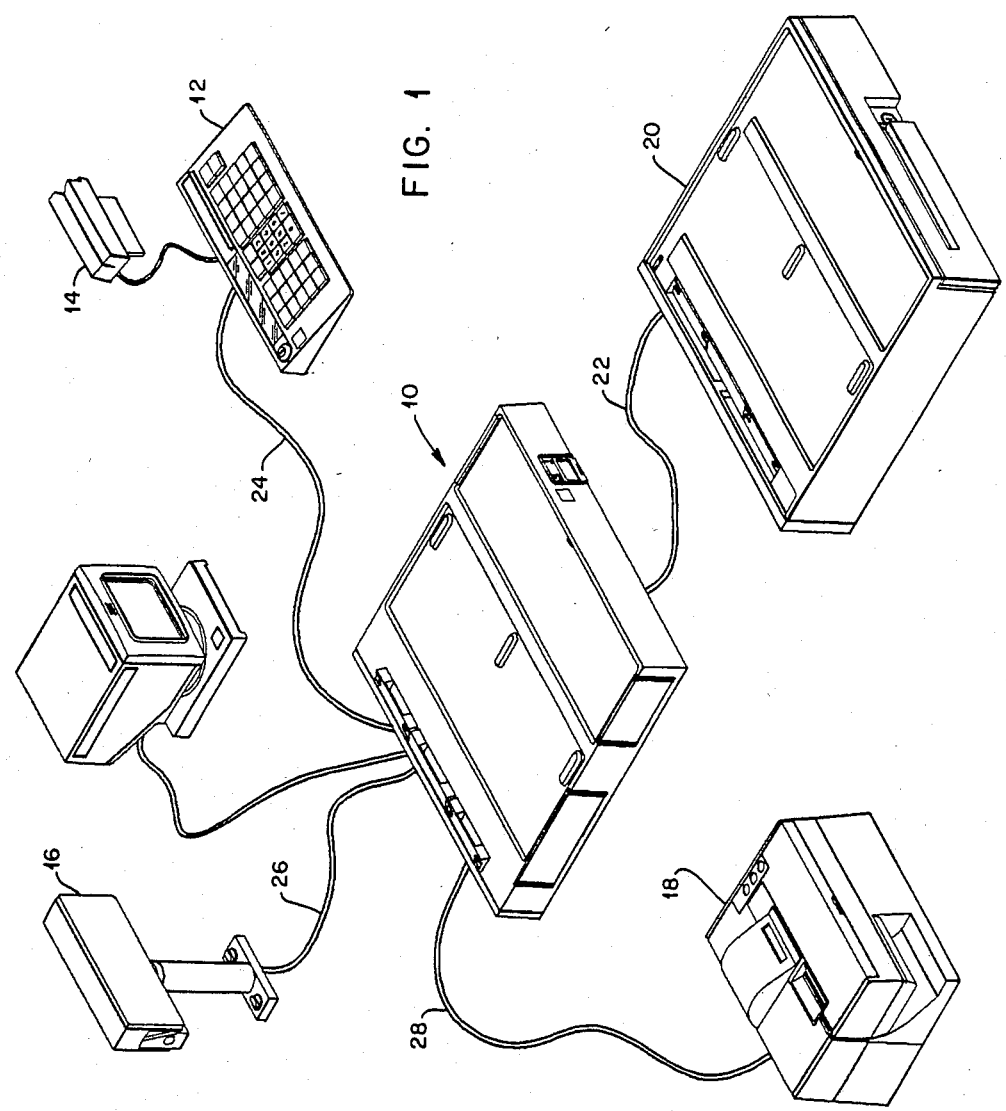
FIG. 1 shows a distinctive data processing system embodying the teachings of the present invention.

FIG. 1 shows a functional representation of a data processing system wherein the present invention may be used. The data processing system is a point of sale terminal which is specifically suited for use in the retail industry. The data processing system includes a main processing unit (MPU) identified by numeral 10 and a plurality of I/O devices identified by numerals 12, 14, 16, 18 and 20. The I/O devices are connected by communication media 22–28 to the main processing unit. The present invention (to be described subsequently) is primarily concerned with the packaging of the main processing unit. It should be noted that although the present invention is described in relationship with a point of sale terminal this should be construed as being illustrative rather than a limitation on the scope of the present invention. It is the intent that this invention should cover any device wherein electromagnetic radiation and customer maintenance problems are present.

Figure 2:
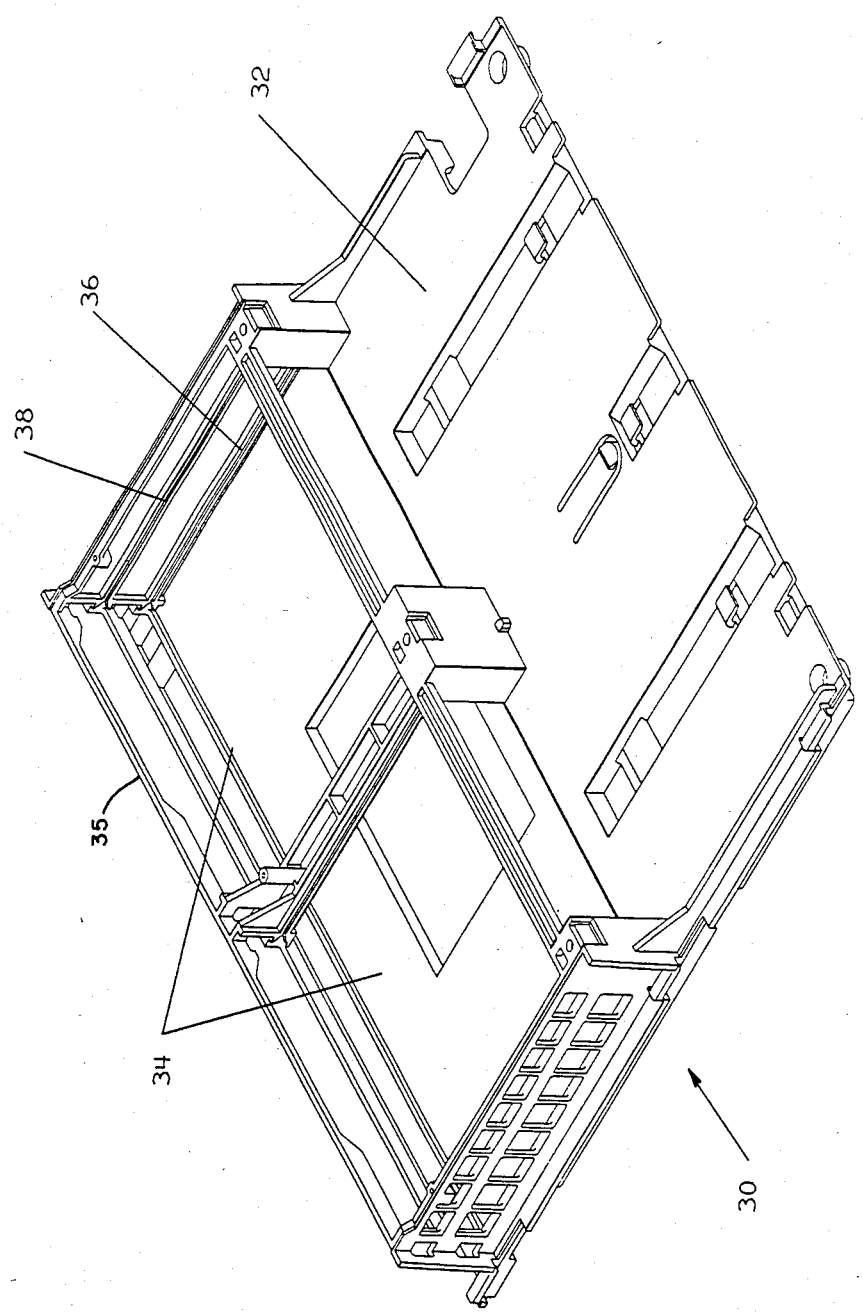
FIG. 2 shows the shield envelope for the bottom and sides of the MPU of FIG. 1.

FIG. 2 shows the first part or section of the MPU housing which functions as a shielding envelope and is identified by numeral 30. The housing includes two compartments identified by numerals 32 and 34, respectively. Compartment 32 provides the nesting area for the power supply (to be described later). Similarily, compartment 34 provides the nesting area for the main logic card and feature logic cards (to be described hereinafter). A bottom guide rail 36 and a top guide rail 38 are fabricated on the inside walls of the side member. As will be explained subsequently, the guide rails support a lower main logic and upper feature logic cards. The logic cards are placed on the guide rails through appropriate openings in front wall 35. If a single logic card is used, filler panels (to be described later) is used to close the unused opening. Preferably, the base and side wall members are fabricated from molded plastic which is plated with a layer of 100% metal. The metal used is an electroless deposition of phosphorus/nickle over copper.

Figure 3:
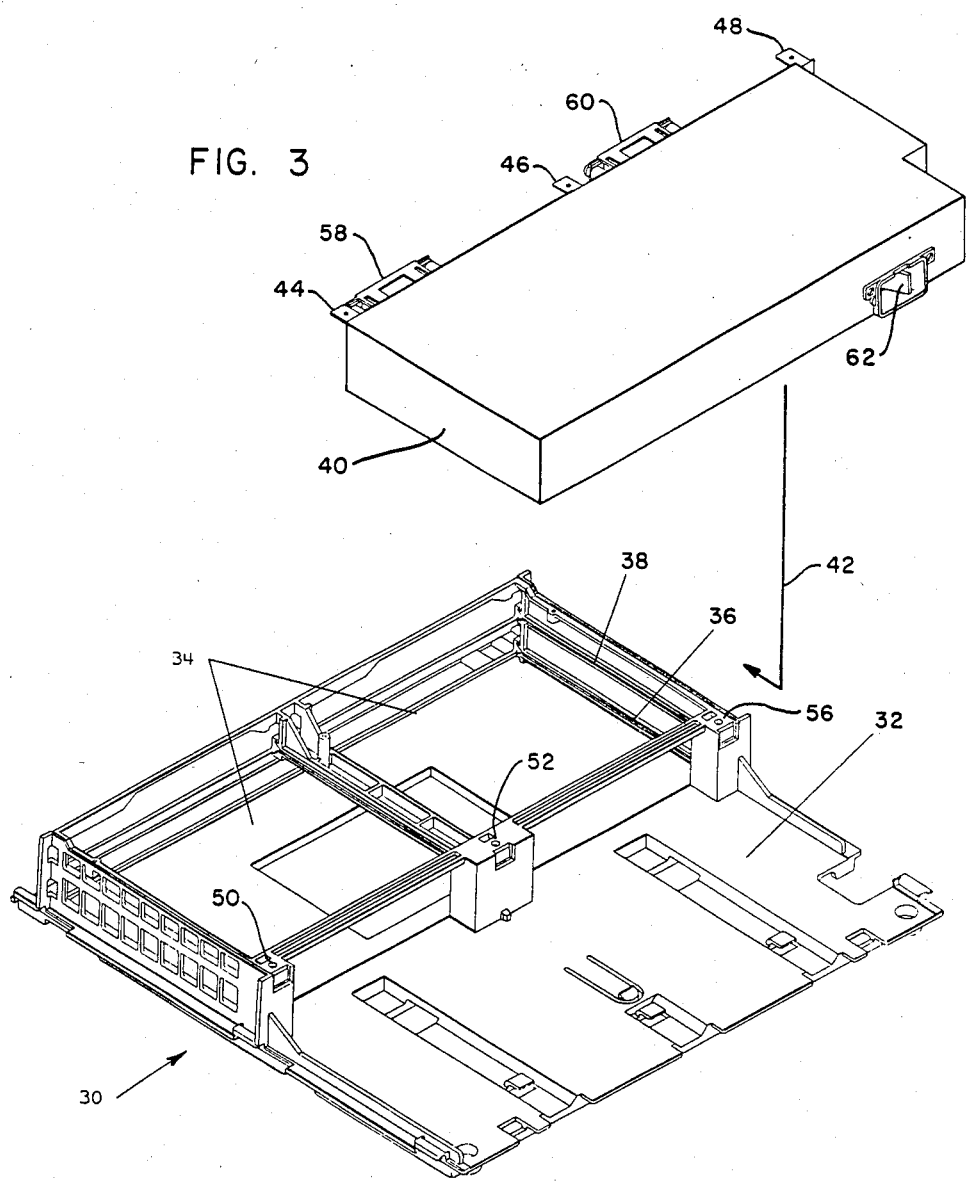
FIG. 3 shows a power supply and the methodology for placing it within the shield envelope.

FIG. 3 shows the first step in packaging the MPU unit in accordance with the teaching of the present invention. The power supply 40 is next fitted in nesting area 32. The orientation of power supply 40 is shown by arrow 42. The power supply 40 is encased with a metal shell. A plurality of projections identified by numerals 44, 46 and 48 are extended from the metal casing. As will be explained subsequently, the projections are fitted with openings which align with complementary openings 50, 52 and 56 to hold the power supply securely against the base and to provide a good ground connection therebetween. As will be seen subsequently, the power supply enclosure also becomes one surface of the card EMI shield. Output connectors 58 and 60 are permanently attached to the power supply. As will be explained subsequently, these output connectors mate with plugs in the card to distribute electrical power to the MPU unit. In addition, the output connectors act as communication buses between the main logic card and optional logic cards. In this regard, the output connectors distribute electrical signals. On/Off switch 62 is disposed in a slot formed in the housing of the power supply.

FIG. 4 introduces another element of the MPU and another step in the assembling procedure. The power supply 40 is fastened through the previous described holes onto the bottom and side radiation shield member by a plurality of screws. Stiffener 64 provides the top EMI shield for the MPU unit. It also forms a partial rear shield. The stiffener is fabricated from a sheet metal material and has a substantially L-shape cross-sectional area. A plurality of openings identified by numerals 66, 67, 68, 69, 70 and 72 are fabricated on the top surface. The function of the openings is to attach the stiffener 64 to the bottom and side sections of the radiation housing. Elongated openings identified by numerals 74 and 76 are fabricated in one surface of the stiffener member. The function of these elongated openings is to give access to the I/O receptacles (to be described subsequently) which connect an I/O unit to the MPU. The orientation of the stiffener member 64 relative to the other components of the MPU shield is shown in FIG. 5.

Figure 5:
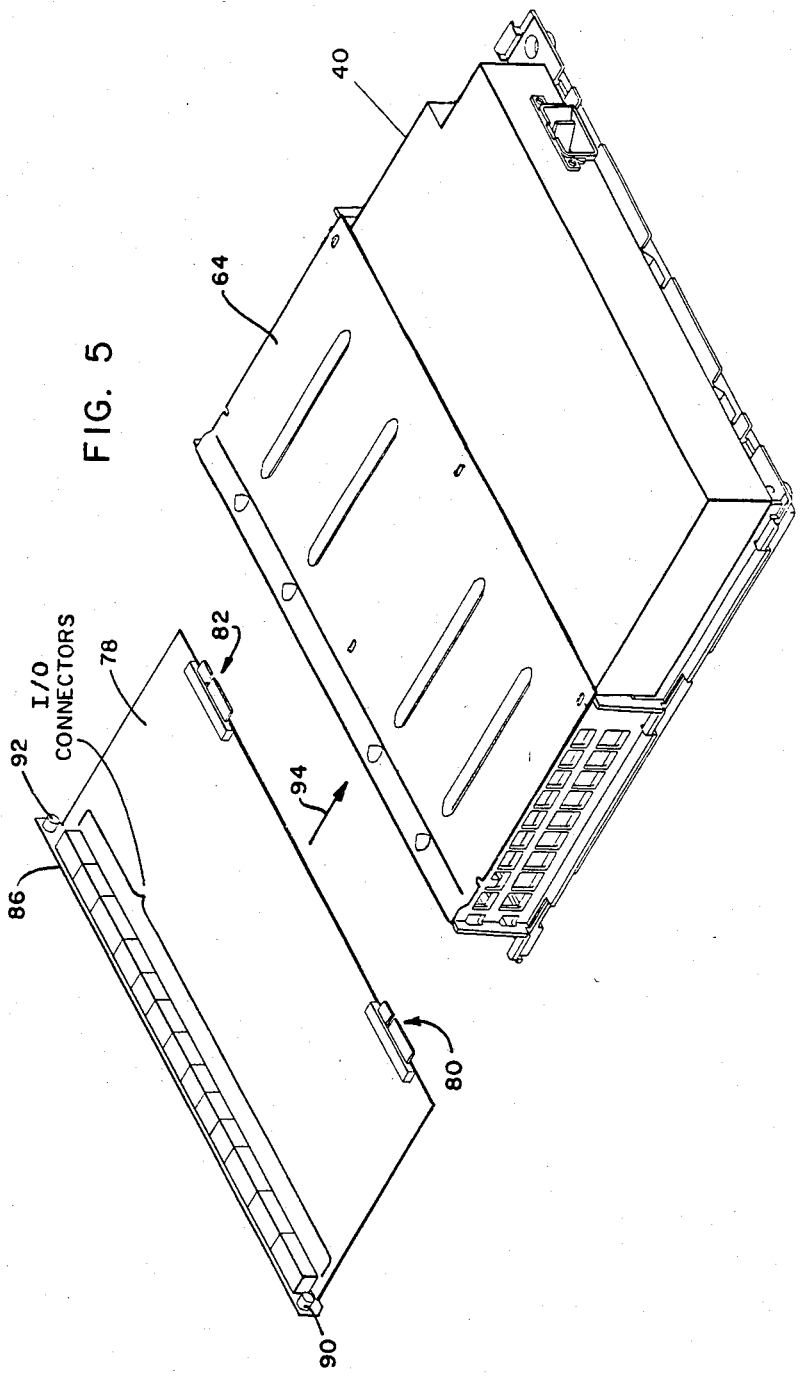
FIG. 5 shows the assembled shield envelope and the main logic card.

FIG. 5 shows another step in the assembling methodology and introduces another element of the MPU unit. The stiffener member 64 is securely fastened through the above described holes to the power supply and the conductive bottom and side sections of the EMI housing. The figure also shows the card and final closure assembly 78. The card provides the support surface for the electronic components (not shown) which forms the internal portion of the MPU. Those electronic devices may include microprocessors, RAM, ROM, etc. A plurality of lands or electrical connections (not shown) are provided on the surface of card 78. These lands interconnect the various electrical devices. In order to distribute power to the card, power connectors 80 and 82 are fabricated on the leading edge of the card. The power connector mates with the previously described power output connectors 58 and 60 (FIG. 3) to supply and distribute power to the components supported on the card. A plurality of I/O connectors are arranged in juxtaposition and are coupled to the rear edge of the card. These I/O connectors are the receptacles that accept plugs from remote I/O units and form an electrical interface so that electrical communication is effectuated between the external units and the electrical devices on the card. In addition to providing the electrical interface between external units and the card, the I/O connectors form a part of the closure arrangement for the electromagnetic radiation shield. It should be noted that if multiple cards occupy the EMI housing of FIG. 5 the structure and configuration of each card is identical.

Figure 7:
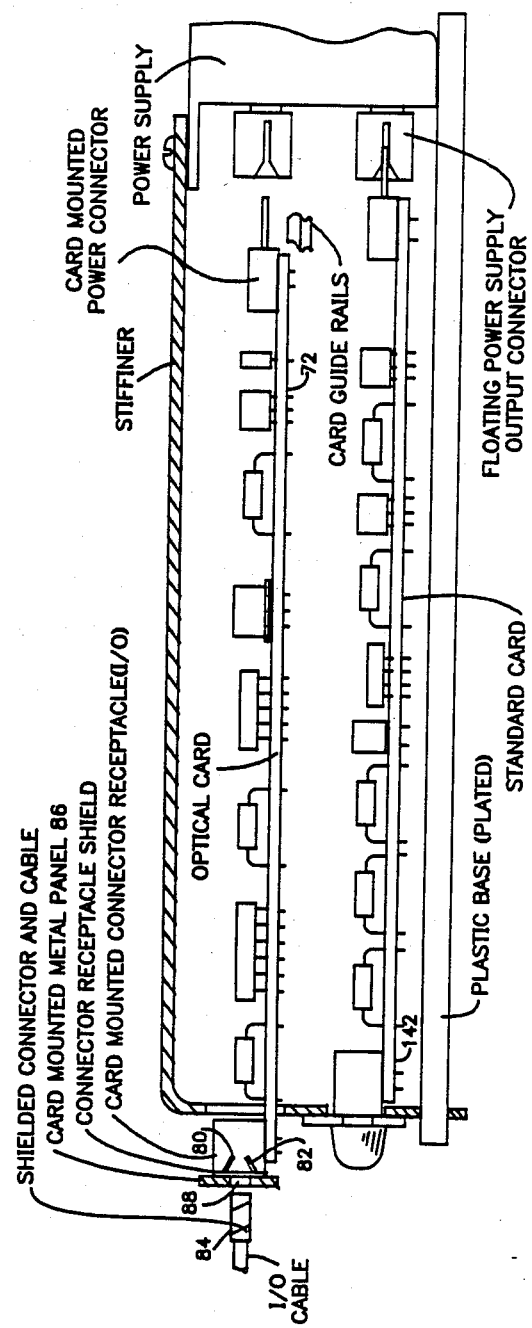
FIG. 7 shows a cross-section of the assembled device.

Referring to FIG. 7 for the moment, a cross-section of the MPU is shown. In this cross-sectional view each card mounted connector receptacle I/O has a connector receptacle shield which is a metallic face plate on its entry side and metallic straps extending inwardly into the opening. For example, two of the inwardly extending metal straps are shown in the figure and identified by numerals 80 and 82. As will be explained subsequently, when a plug 84 from a shielded connector and cable assembly is inserted into the receptacle opening, the straps 80 and 82 provides electrical ground continuity between the plug and the receptacle.

Referring to FIGS. 5 and 7 simultaneously, an elongated planar member identified as card mounted metal panel 86 is fabricated with an elongated slot 88 therein. The opening provides access to the I/O receptacles. The opening enables the plug from external I/O units to be inserted into the stationary I/O receptacles. The metal panel fits flush against the metal face plate of the I/O receptacles. In addition, when the card is plugged into the power supply receptacle, the elongated member provides a conductive path between the previously described conductive housing and the connector receptacles.

In order to attach the elongated member firmly against the conductive housing of the MPU unit, a plurality of quarter-turn fasteners identified by numerals 90 and 92 are fabricated on each extremity of the elongated member. The orientation of the card 78 relative to the other elements of the MPU housing is shown by arrow 94.

Figure 6:
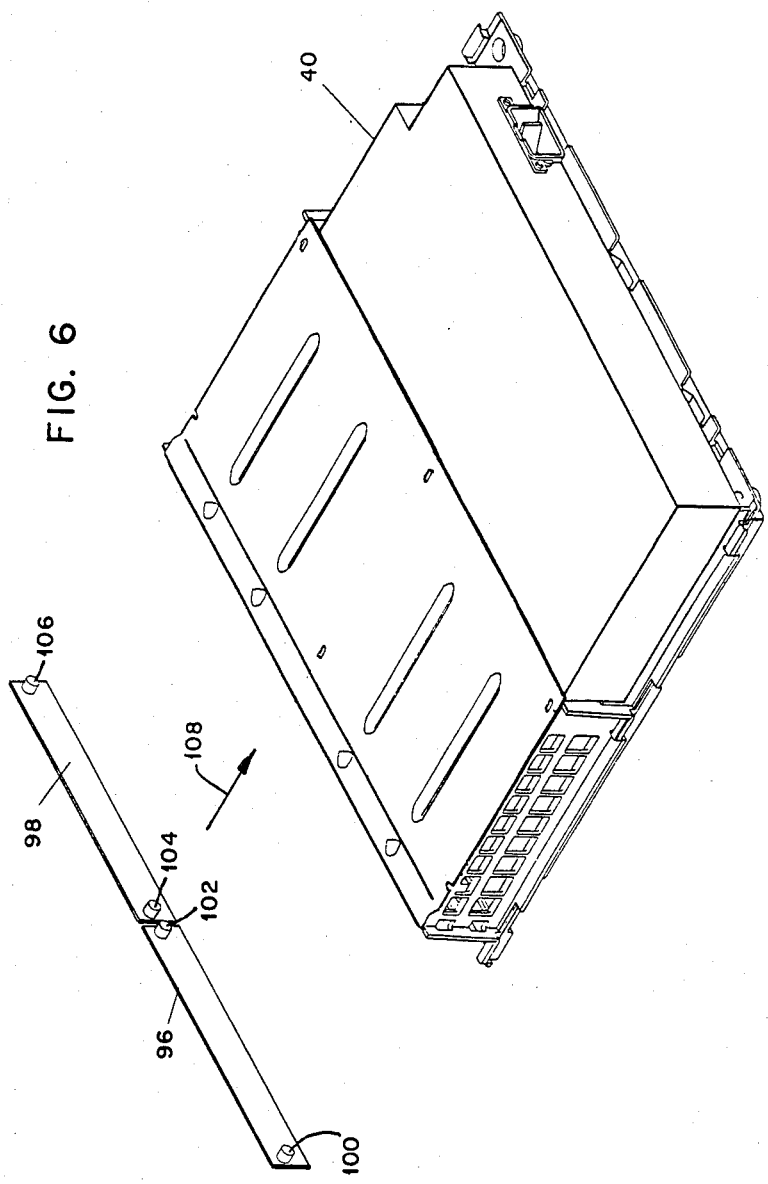
FIG. 6 shows the assembled shield envelope and filler panels for closing the envelope.

As was pointed out above, the MPU unit may contain single logic card 78 plus two optional cards. However, when a single card is inserted into the MPU unit, a pair of filler panels identified by numerals 96 and 98 (FIG. 6) are used to close the back openings and complete the radiation shield. The filler panels are shown in FIG. 6. Each filler panel includes two spaced apart quarter-turn fasteners identified by numerals 100, 102, 104 and 106. The orientation of the filler panels relative to the other components of the MPU is shown by arrow 108.

For purposes of demonstration, the showing in FIG. 7 provides two circuit cards, a top circuit card 72 and a bottom circuit card 79. Each of the cards is populated with a plurality of electrical devices. If only a single circuit card 72 is used or no circuit card 72 is present, the previously-described filler panel fills the back opening of the unused card slots. In FIG. 7, the circuit card 72 is shown in a non-operative position, wherein the power connector is displaced from its floating power output connector. The lower circuit card is shown plugged into the floating power connector. The I/O cables previously described are shielded and are fitted with plugs which plug into the I/O connectors. In FIG. 7 the plug is displaced from its connector.

Preferably, the cable shield is permanently terminated to the connector plug. When the connector plug is inserted into the receptacle, the receptacle internal shield fingers contact the plug. The earth ground path for the cable shield is thus: cable shield terminated to cable plug, metal shell of the plug mates with fingers of receptacle, receptacle shield clamped to panel, panel clamped to stiffener by quarter-turn fasteners, stiffener screwed to metal power supply shell, and the power supply shell is a power cord earth ground. With this scheme, cards and cables are customer serviceable without tools and the EMI shield is secured.

Also, to replace a card a user need only to unplug the cables, loosen the quarter-turn fastener and pull out the card from the power supply output connector. A new card can then be inserted. The card mounted panel is then placed in its position, the quarter-turn fastener is tightened, and the electromagnetic prevention feature of the unit is not compromised.

Still referring to FIG. 7, it should be noted that in order to close the EMI shield the card mounted metal panel is securely clamped to the stiffener. This mounting scheme locates the card and incures tolerance accumulated between the card power connector and the mating connectors mounted on the power supply. To overcome this problem, sufficient overtravel is designed into the mating connectors, in the insertion axis to compensate for tolerance accumulation in that axis. The power supply output connectors float within limits to compensate for tolerance accumulation in the vertical and horizontal axis.

While the invention has been particularly shown and described with reference to the preferred embodiments thereof, it will be understood by those skilled in the art that various changes in form and details may be made therein without departing from the spirit and scope of the invention.

Having thus described our invention, what we claim as new, and desire to secure by Letters Patent is:

1. A system for providing EMI shielding enclosure and support for electrical devices comprising:

an electrical conductive housing:
an electrical conductive power supply connected to said housing;
a first means operable for supporting electrical devices;
second means operable for electrically coupling the first means to the power supply; and
third means coupled to the first means for providing an electrical interface between external units and the electrical devices and for completing the EMI shielding enclosure when the first means is being plugged into electrical communication with the power supply.

2. The system of claim 1 wherein the electrical conductive housing includes a molded plastic member configured to form a base and side members; a relatively thin metallic layer disposed on the entire surface area of said plastic member; and
an L-shaped metallic top member connected to the side member 8.

3. The system of claim 1 wherein the power supply is covered with a metallic casing.

4. The system of claim 1 wherein the second means includes a pair of spaced electrical receptacles mounted on the power supply; and
a pair of mating plugs mounted on the first means.

5. The system of claim 1 wherein the third means includes a plurality of electrical receptacles mounted in juxtaposition on the first means; with each receptacle having a conductive face plate and internal fingers for mating with electrical plugs;
a planar elongated member operable for forming a conductive path between the face plates and the conductive housing; and
a latching mechanism coupled to the elongated member.

6. An arrangement for closing the conductive housing of an electrical machine so that internal components are being shielded from electromagnetic interference comprising:
a support means operable for carrying a plurality of electrical devices thereon;
at least one electrical receptacle mounted on said support means and operable for providing electrical power on said support means; and
a closure means coupled to said support means and operable for providing an electrical interface between external units and the devices and to engage the conductive housing thereby completing a shielding enclosure.

* * * * *